US012112814B2

(12) United States Patent
Zhang et al.

(10) Patent No.: US 12,112,814 B2
(45) Date of Patent: Oct. 8, 2024

(54) OPEN BLOCK BOUNDARY GROUP PROGRAMMING FOR NON-VOLATILE MEMORY

(71) Applicant: Western Digital Technologies, Inc., San Jose, CA (US)

(72) Inventors: Ke Zhang, Shanghai (CN); Ming Wang, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 258 days.

(21) Appl. No.: 17/837,345

(22) Filed: Jun. 10, 2022

(65) Prior Publication Data

US 2023/0402109 A1 Dec. 14, 2023

(51) Int. Cl.
*G11C 16/04* (2006.01)
*G11C 16/08* (2006.01)
*G11C 16/10* (2006.01)
*G11C 16/26* (2006.01)
*G11C 16/34* (2006.01)

(52) U.S. Cl.
CPC .......... *G11C 16/3459* (2013.01); *G11C 16/08* (2013.01); *G11C 16/102* (2013.01); *G11C 16/26* (2013.01); *G11C 16/3404* (2013.01)

(58) Field of Classification Search
CPC ................ G11C 16/3459; G11C 16/08; G11C 16/102; G11C 16/26; G11C 16/3404
See application file for complete search history.

(56) References Cited

U.S. PATENT DOCUMENTS

| | | | |
|---|---|---|---|
| 8,441,861 B2 | 5/2013 | Spessot et al. | |
| 8,743,615 B2 | 6/2014 | Lee et al. | |
| 9,442,839 B1* | 9/2016 | Sharma | G11C 29/76 |
| 9,449,700 B2 | 9/2016 | Shah et al. | |
| 9,530,517 B2 | 12/2016 | Lee et al. | |
| 9,552,171 B2 | 1/2017 | Huang et al. | |
| 10,198,217 B2 | 2/2019 | Li | |
| 10,734,084 B2 | 8/2020 | Kuddannavar et al. | |
| 11,081,162 B1* | 8/2021 | Puthenthermadam | G11C 16/10 |
| 11,152,059 B2 | 10/2021 | Papandreou et al. | |
| 2006/0168414 A1* | 7/2006 | Nobunaga | G11C 16/22 711/163 |
| 2016/0179428 A1 | 6/2016 | Parker et al. | |
| 2020/0004440 A1 | 1/2020 | Koudele et al. | |

* cited by examiner

*Primary Examiner* — Pho M Luu
(74) *Attorney, Agent, or Firm* — Vierra Magen Marcus LLP

(57) ABSTRACT

Technology for open block boundary group programming of non-volatile memory such as NAND. The open block boundary group could potentially be read in response to a request from a host for the data stored in the group. In an aspect, the memory system will determine whether programming a group of memory cells in a selected block will result in an open block. If it will not result in an open block, then the memory system uses a first set of programming parameters to program the group. However, if it will result in an open block then the memory system uses a second set of programming parameters to program the boundary group. The programming parameters may include verify levels and/or a program voltage step size. The second set of programming parameters can tighten Vt distributions, which mitigates mis-reads if the boundary group is read.

20 Claims, 19 Drawing Sheets

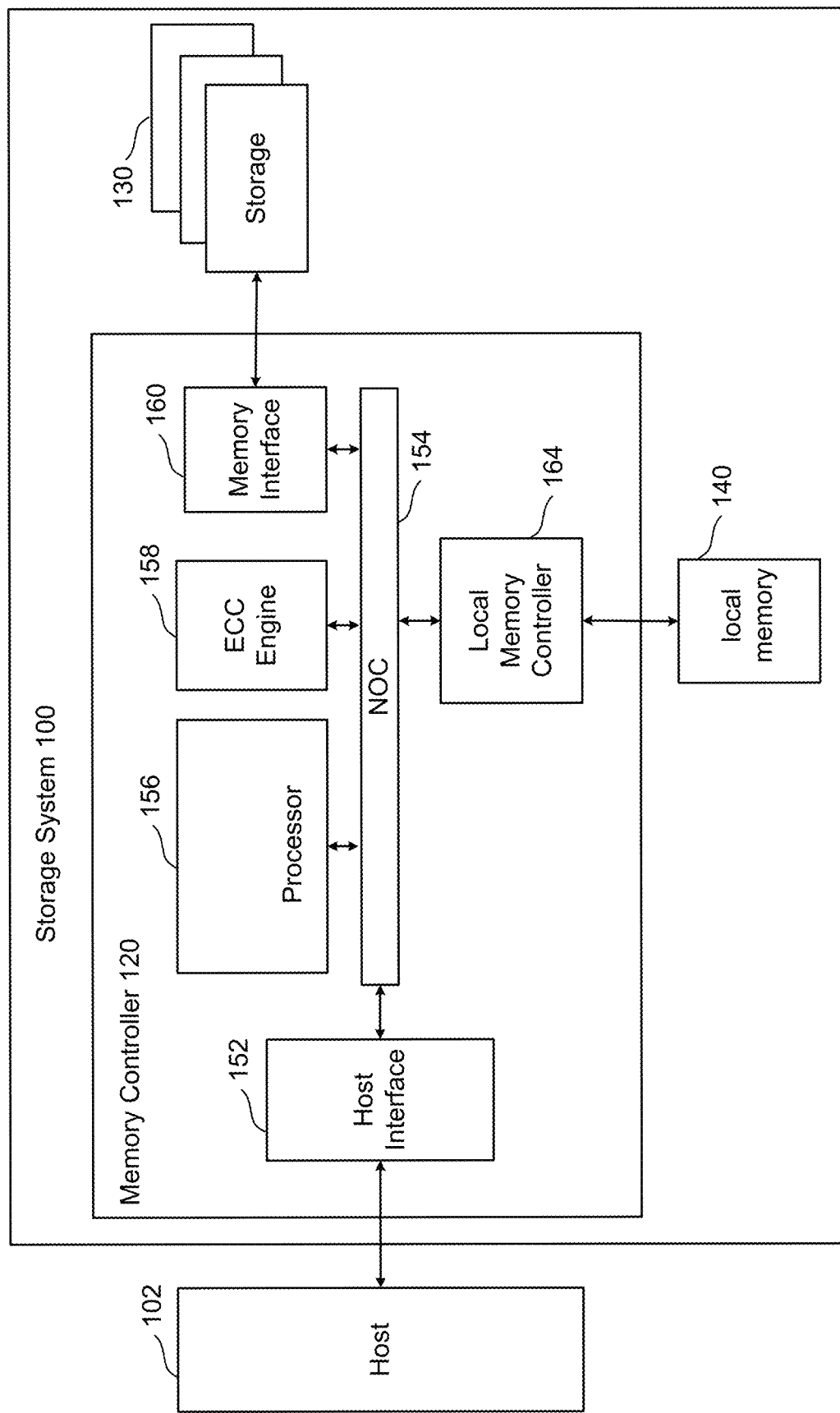

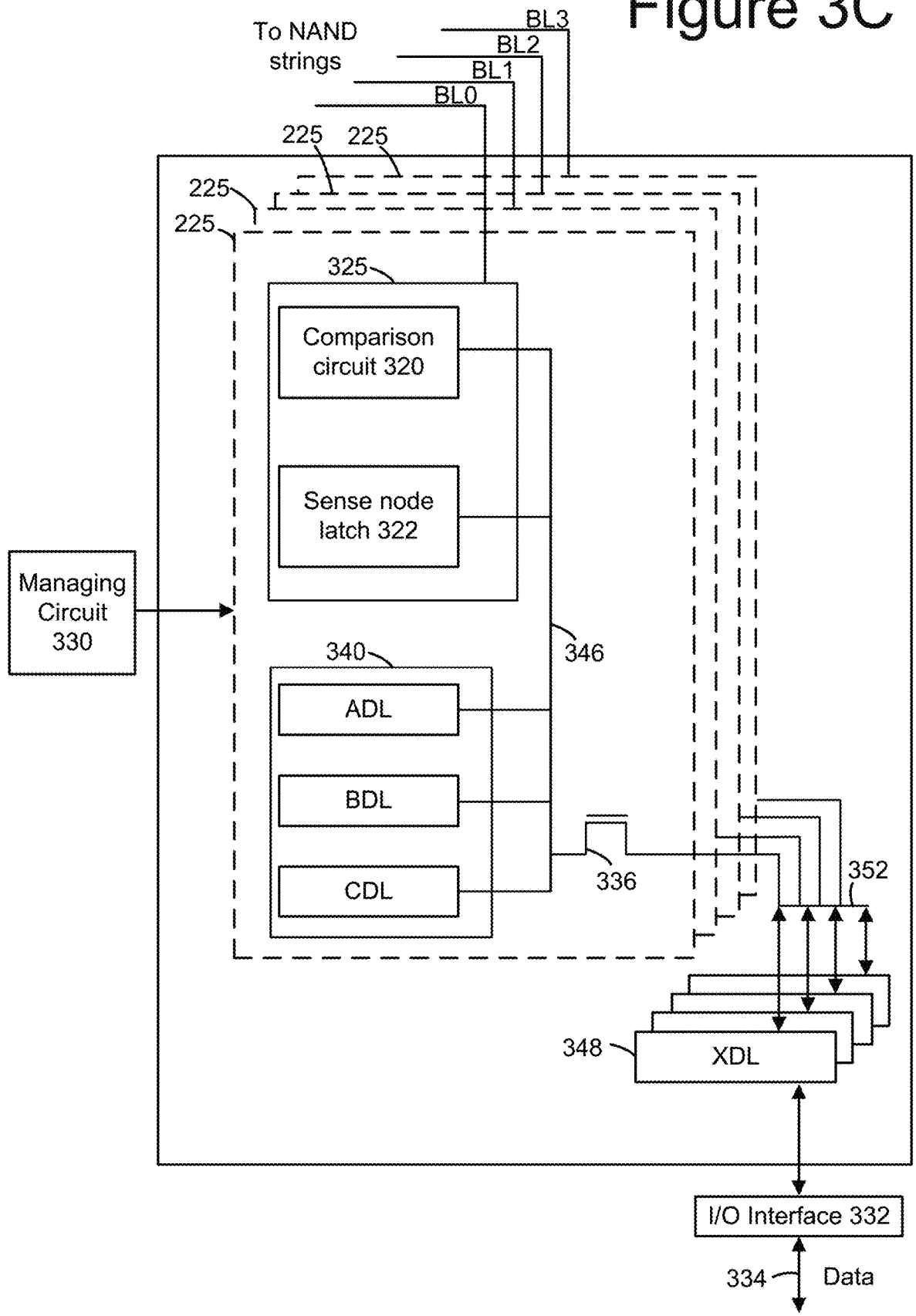

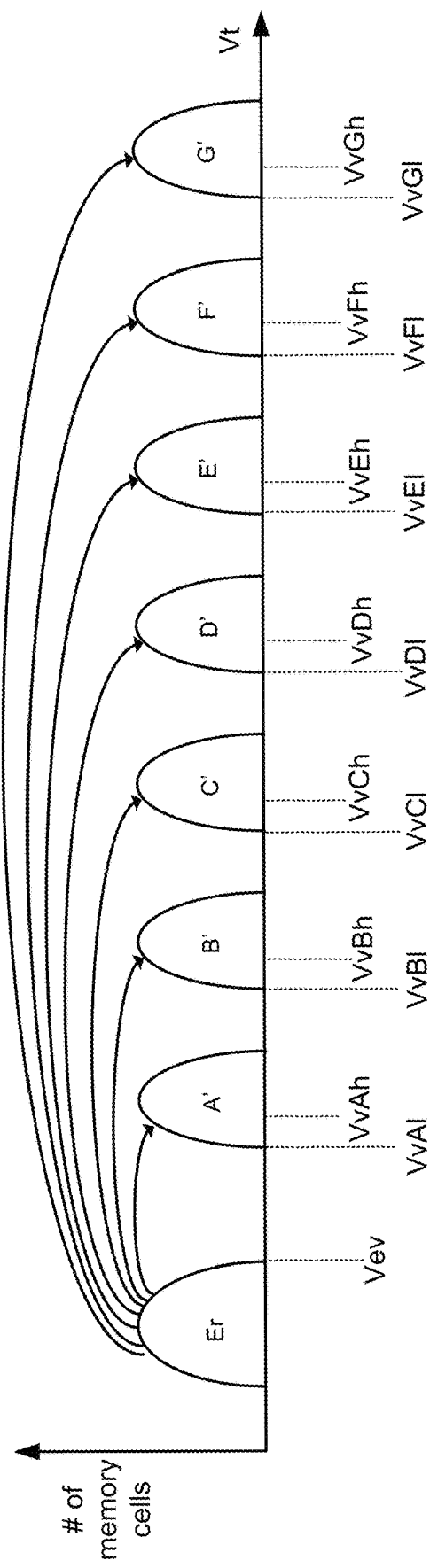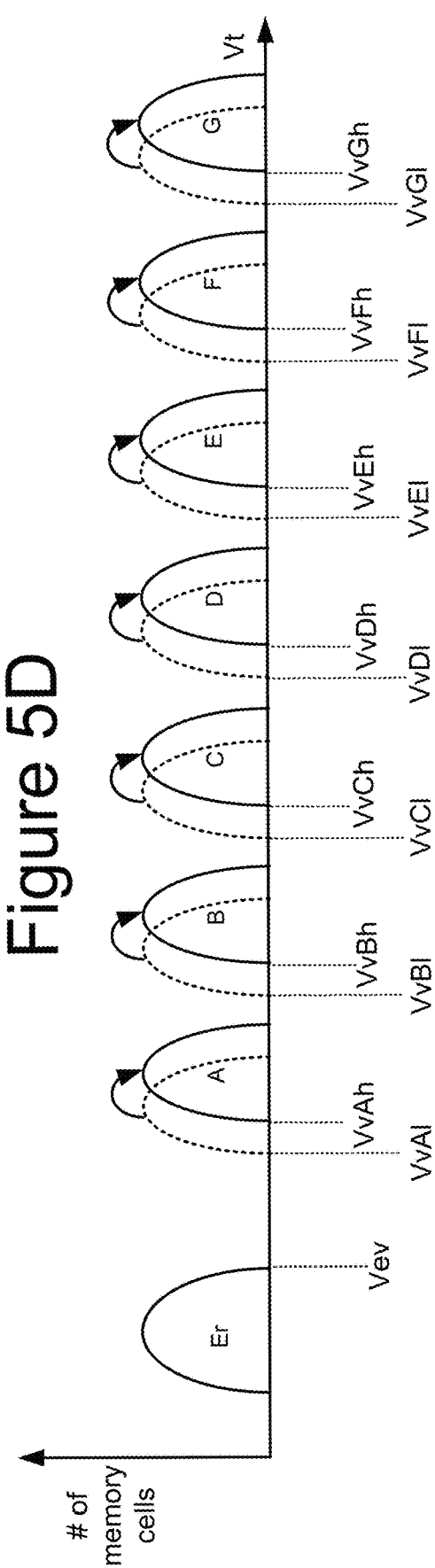

| WL | SB0 | SB1 | SB2 | SB3 |
|---|---|---|---|---|
| WL0 | | | | |
| WL1 | | | | |
| WL2 | | | | |
| WL3 | | | | |
| WL4 | | | | |
| WL5 | | | | |
| ... | | | | |
| ... | | | | |
| ... | | | | |
| WLn-2 | | | | |
| WLn-1 | | | | |
| WLn | | | | |
| WLn+1 | | | | |
| WLn+2 | | | | |
| ... | | | | |
| ... | | | | |
| ... | | | | |
| WL108 | | | | |
| WL109 | | | | |
| WL110 | | | | |
| WL111 | | | | |

710, 720, 730

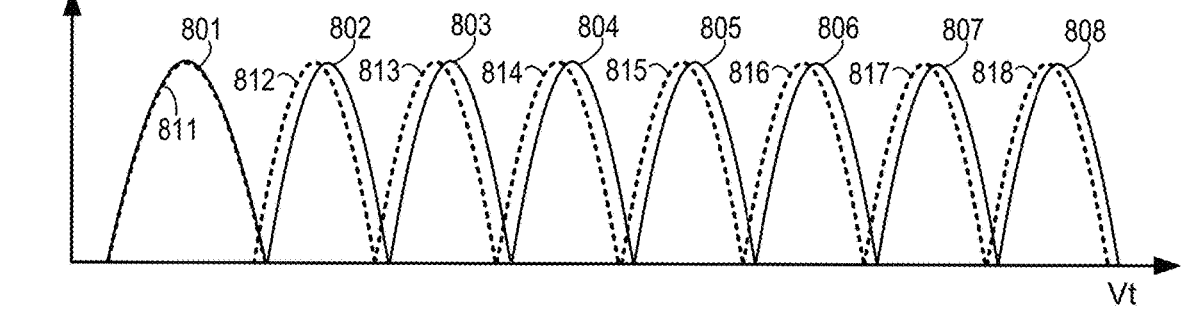
Figure 8
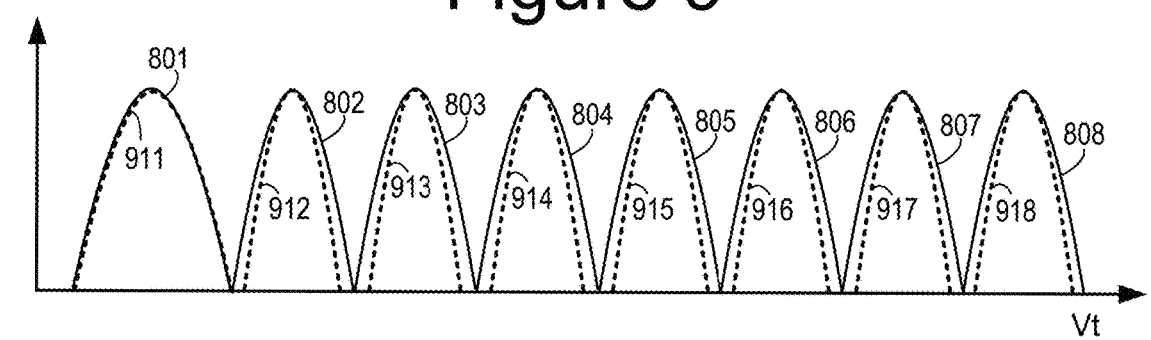
Figure 9
Figure 10
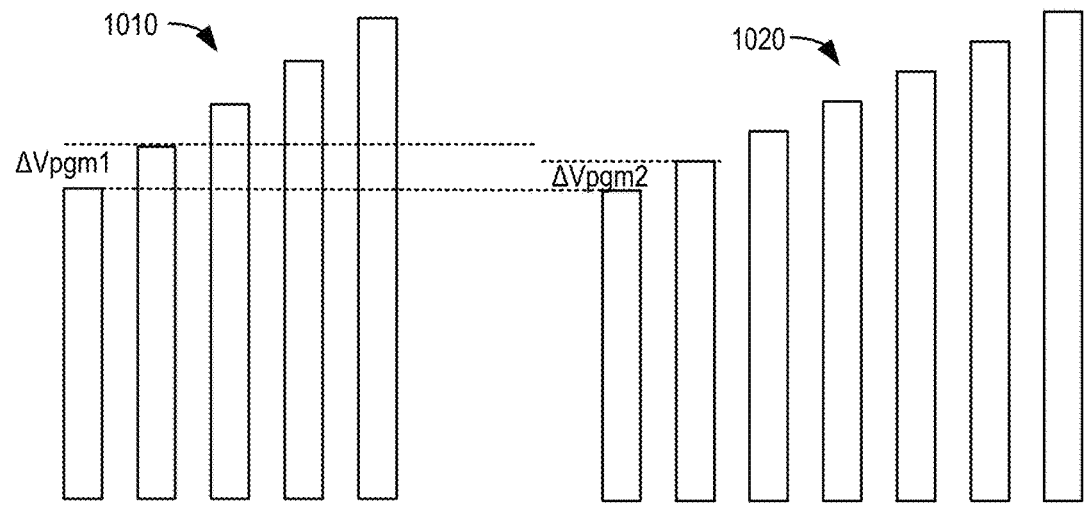

```
Memory controller sends one or more commands to die to
change one or more programming parameters                    ─1302
                          ↓
Memory die accesses the temporary programming parameters
from storage on the memory die and/or the command(s)         ─1304
                          ↓
Memory controller sends data to be programmed and address at
which to program the data                                    ─1306
                          ↓
Memory die programs the data at the addresses using the
temporary programming parameters                             ─1308
```

| Case | Verify Upshift | | | | | | | ΔVpgm | Loop Count | STP_FINE |
|------|---|---|---|---|---|---|---|---|---|---|
|      | A | B | C | D | E | F | G | | | |
| Case 1 | 12 | 13 | 15 | 15 | 15 | 15 | 15 | -6 | 2 | disable |
| Case 2 | 10 | 12 | 12 | 14 | 15 | 15 | 15 | -5 | 2 | disable |
| ... | | | | | | | | | | |
| ... | | | | | | | | | | |
| Case n | | | | | | | | | | |

1402, 1404, 1406, 1408, 1410

OPEN BLOCK BOUNDARY GROUP PROGRAMMING FOR NON-VOLATILE MEMORY

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block. In some architectures such as NAND, each memory cell is connected to a word line and will typically have a first neighbor memory cell connected to a first neighbor word line and a second neighbor memory cell connected to a second neighbor word line. However, a memory cell at the edge of a block (e.g., near the end of the NAND string) will only have one neighbor memory cell that is used to store data.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of programming voltage pulses are applied to the control gates of the memory cells. Each voltage pulse may be stepped up in magnitude from a previous program pulse by a step size in a processed referred to as incremental step pulse programming. Each program voltage may be followed by a verify operation to determine if the respective memory cells have been programmed to the desired memory state. Thus, the program operation may include a number of program/verify loops. The word line that is connected to the memory cells being verified is referred to herein as the "selected word line." The remaining word lines connected to other memory cells on the NAND strings are referred to herein as "unselected word lines."

The memory cells are erased prior to programming NAND memory cells. Typically the unit of erase is much larger than the unit of program. In some architectures, an entire block of memory cells are first erased. Then, the memory cells are programmed group by group until the entire block of cells have been programmed. When the entire block of cells has been programmed this is referred to as a "closed block." After at least one group of cells has been programmed but there is still one or more groups of memory cells yet to be programmed this is referred to herein as an "open block" or alternatively as a "partially programmed block."

In some cases, programming an adjacent memory cell after finishing programming a target memory cell can alter the apparent Vt of the target memory cell. The aforementioned interference may be referred to as near word line interference (NWI). NWI can shift the apparent Vt of the target memory cell due to the electric field introduced by charge injected into a charge trapping layer of the adjacent cell when programming the adjacent cell. The degree of NWI depends on the separation between the word lines. A reduction of space between word lines therefore may result in greater NWI effect.

In some cases, the charge that is stored on an adjacent memory cell can alter the actual Vt of a target memory cell, which may be referred to as lateral data retention (lateral DR). Lateral DR is the shifting of trapped electrons or holes from cell to cell or from cell to the area in between the cells. That shift happens in the charge trapping layer because electrons and holes can move around to a small extent in the charge trapping layer. Lateral DR depends on the amount of charge stored in the charge trapping layer of the adjacent memory cell. More charge (and hence higher Vt) results in a greater interference on the target memory cell.

In some cases, the entire block will be programmed prior to a read. However, in other cases, a partially programmed block of memory cells will be read, which is referred to as an "open block read." Technical challenges exist when managing open blocks. For example, reading the open block can result in mis-reads due to different physical conditions that exist in the open block relative to the closed block. The aforementioned NWI and lateral DR issues can lead to mis-reads in the open block. Some memory systems will undertake special reading procedures for an open block read. However, such special procedures can significantly increase the time for an open block read. Some memory systems will program dummy data into the open block as a way to mitigate mis-reads when reading the last group of memory cells that were programmed. However, programming dummy data into the open block reduces the effective amount of the storage.

BRIEF DESCRIPTION OF THE DRAWINGS

Like-numbered elements refer to common components in the different figures.

FIG. 1 is a block diagram depicting one embodiment of a storage system.

FIG. 3C is a block diagram depicting one embodiment of a portion of column control circuitry that contains a number of read/write circuits.

FIG. 5C depicts one embodiment of threshold voltage distributions in a first pass of a foggy-fine programming technique.

FIG. 5D depicts one embodiment of a threshold voltage distributions of a second pass of the foggy-fine programming technique of FIG. 5C.

FIG. 7 is a diagram that depicts an open block.

FIG. 8 depicts two sets of example threshold voltage distributions.

FIG. 9 depicts two sets of example Vt distributions.

FIG. 10 depicts an example of different program voltage step sizes for the non-boundary and boundary groups.

FIG. 13 is a flowchart of one embodiment of a process of the memory system establishing a using a temporary set of programming parameters to program data into a boundary group.

FIG. 14 illustrates one embodiment of a dynamic programming parameter table.

DETAILED DESCRIPTION

Figure 2A:
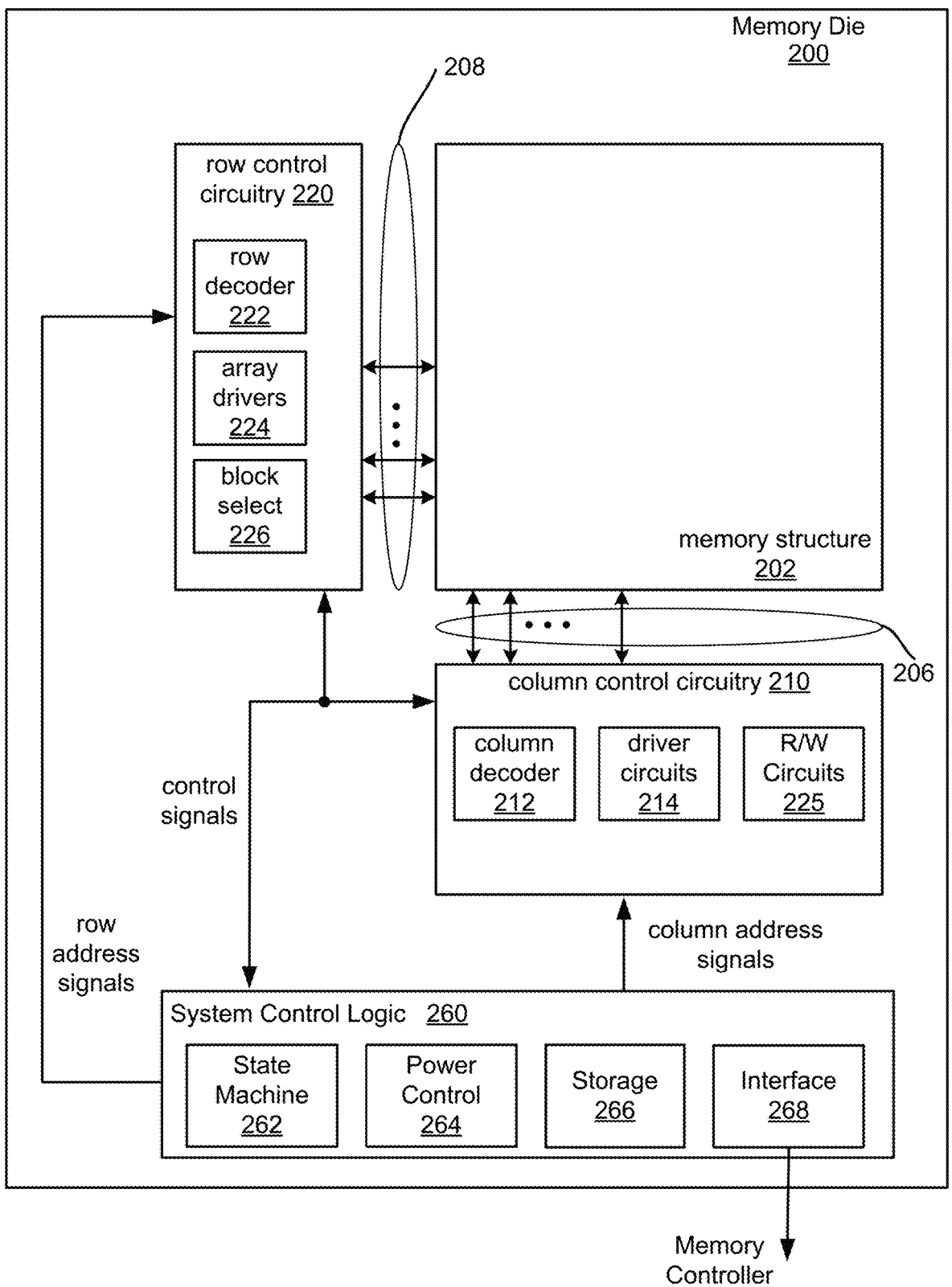
FIG. 2A is a block diagram of one embodiment of a memory die.

Technology is disclosed herein for open block boundary group programming of non-volatile memory such as NAND. Herein, an "open block boundary group" (or more succinctly a "boundary group") is defined as a group of memory cells in an open block for which the neighbor group of memory cells on the neighbor word line on one side is programmed and the neighbor group of memory cells on the neighbor word line on the other side is still in the erased state (e.g., unprogrammed). The boundary group is thus at an open block boundary. There can be more than one boundary group in an open block if the block is programmed by, for example, sub-blocks. A boundary group is typically one of the last groups that was programmed in the open block.

An open block boundary group could potentially be read in response to a request from a host for the data stored in the group. In an embodiment, the memory system will determine whether programming a group of memory cells in a selected block will result in an open block. In other words, the memory system will determine whether that group will be a boundary group. If programming the group will not result in an open block, then the memory system uses a first set of programming parameters to program the group. However, if it will result in an open block, then the memory system uses a second set of programming parameters to program the boundary group. The second set of programming parameters helps to mitigate any possible mis-reads if the boundary group is read.

The set of programming parameters has one or more programming parameters. A given program parameter may be used during a program phase and/or a verify phase. In one embodiment, the programming parameters include a set of program verify reference voltages, with the second set being upshifted in voltage magnitude from the first set. In one embodiment, programming parameters include a program voltage step size, with the program voltage step size being smaller when programming will result in the open block. The second set of programming parameters may include both the upshifted program verify voltages and the decreased program voltage step size. The upshifted verify voltages and/or the smaller program voltage step size helps to tighten the individual threshold voltage distributions, which reduces or eliminates any mis-reads if the group is read while the open block condition persists.

Therefore, special read techniques are not required for the open block read, thereby saving time. Also, it is not necessary to program dummy data in memory cells that are adjacent to the boundary group in the open block. Therefore, the storage space is used efficiently.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Such parameters may include a ramp rate for a voltage applied to a word line during a verify operation, as disclosed herein. In an embodiment, the word lines are divided into zones based on their location in a block of memory cells. There may be a separate ramp rate for each zone.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing.

This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
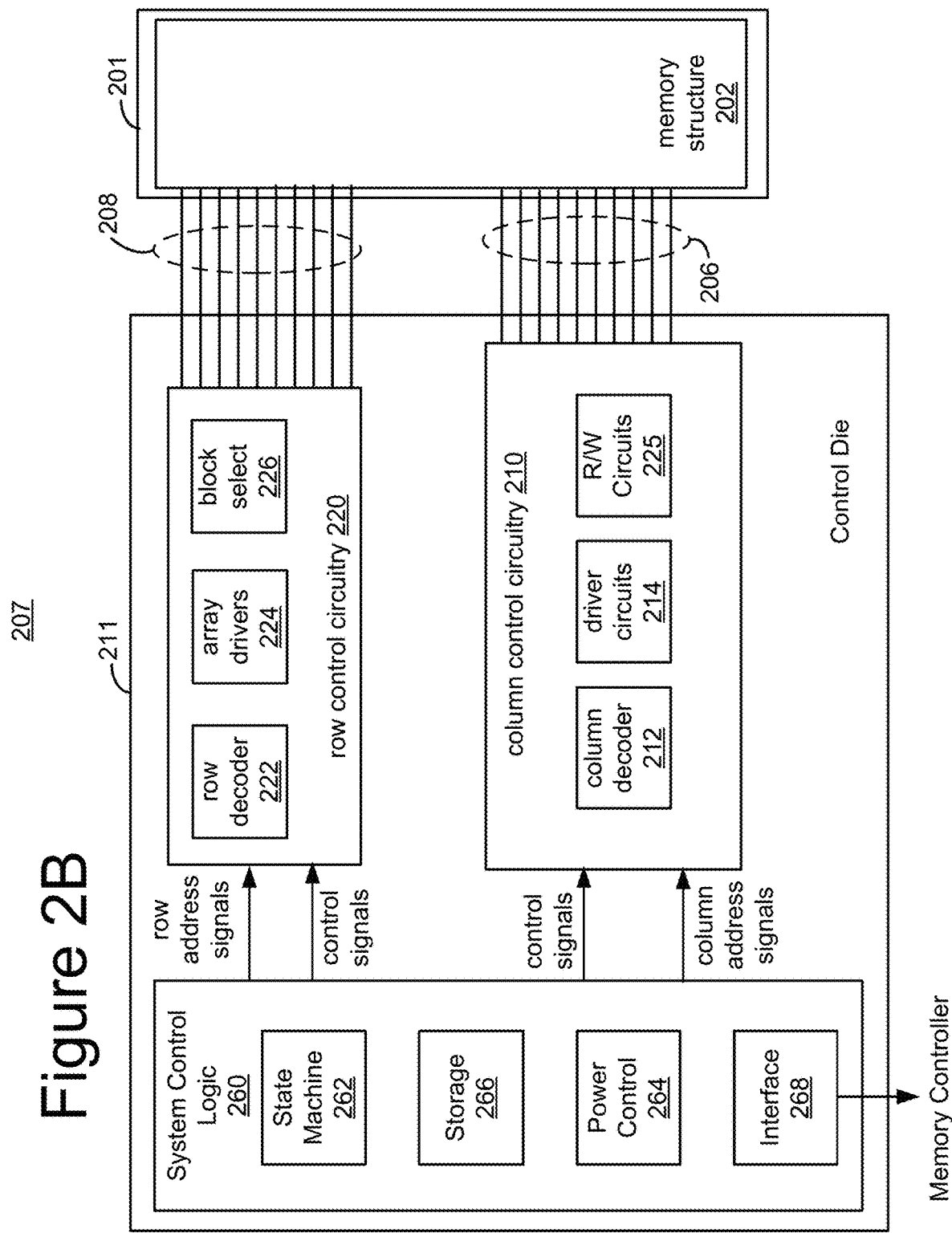
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
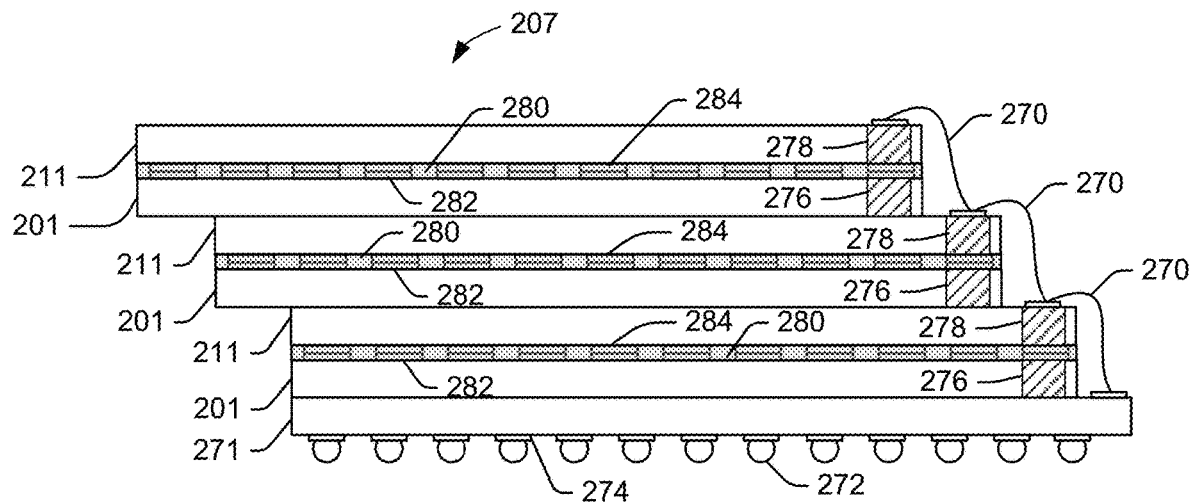
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
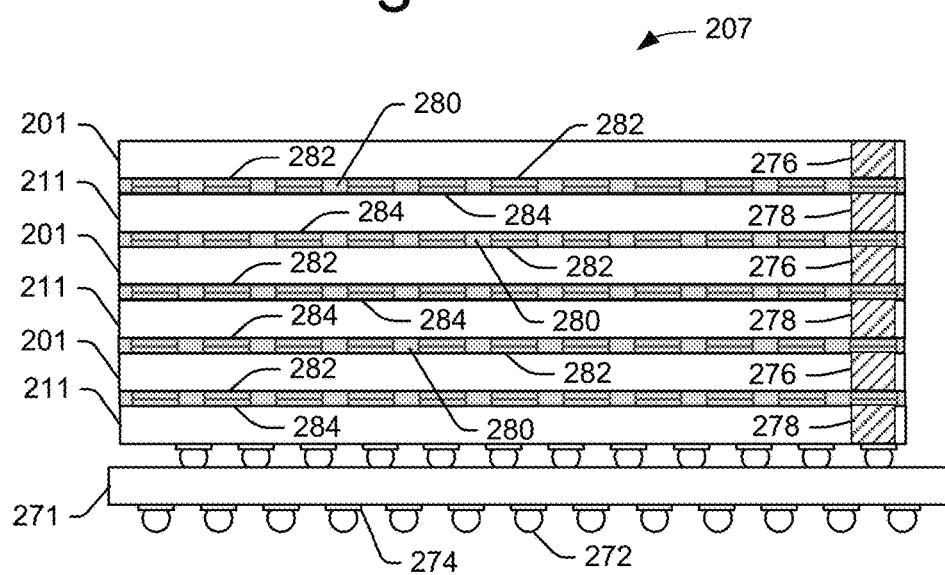

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
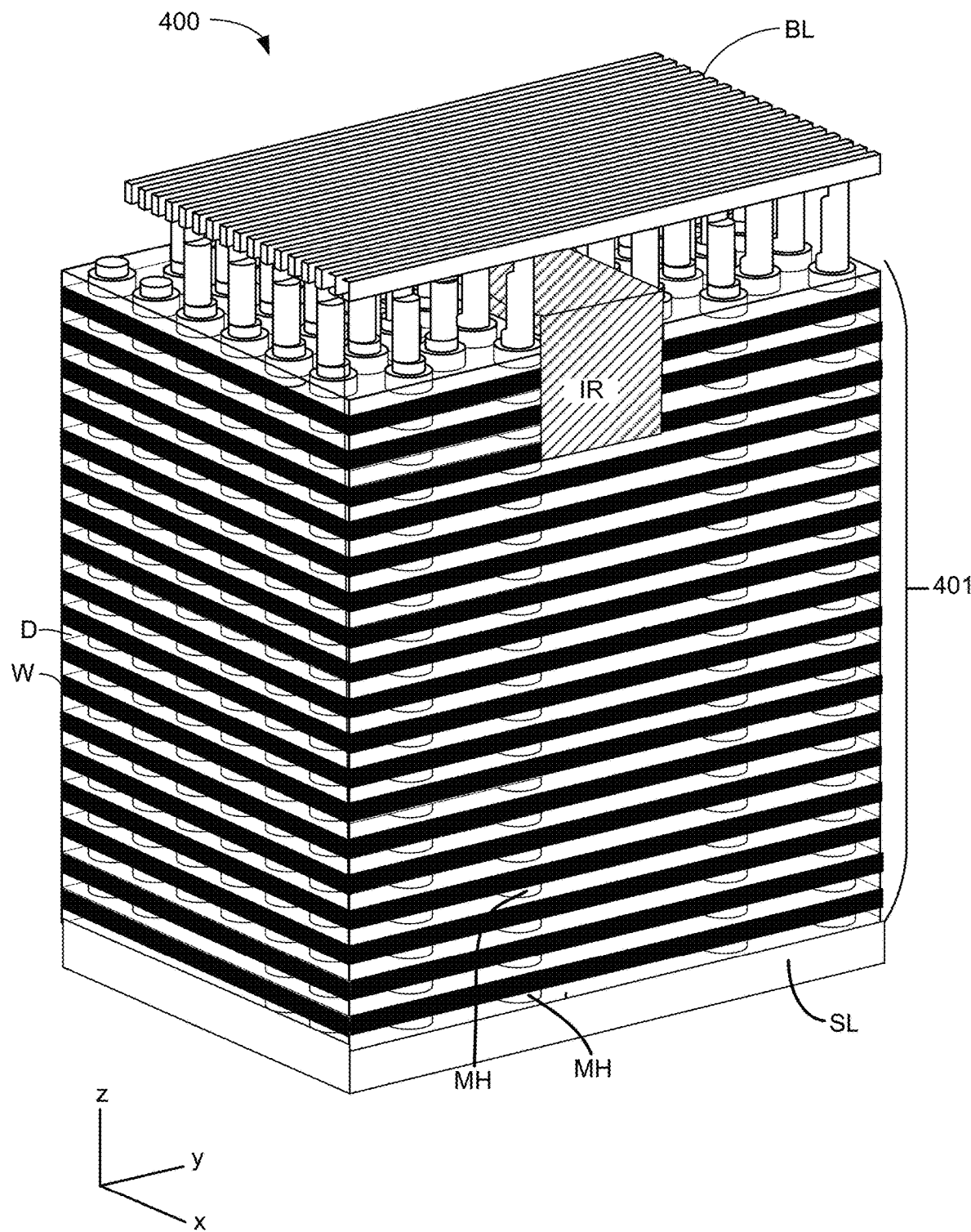
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MHI. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
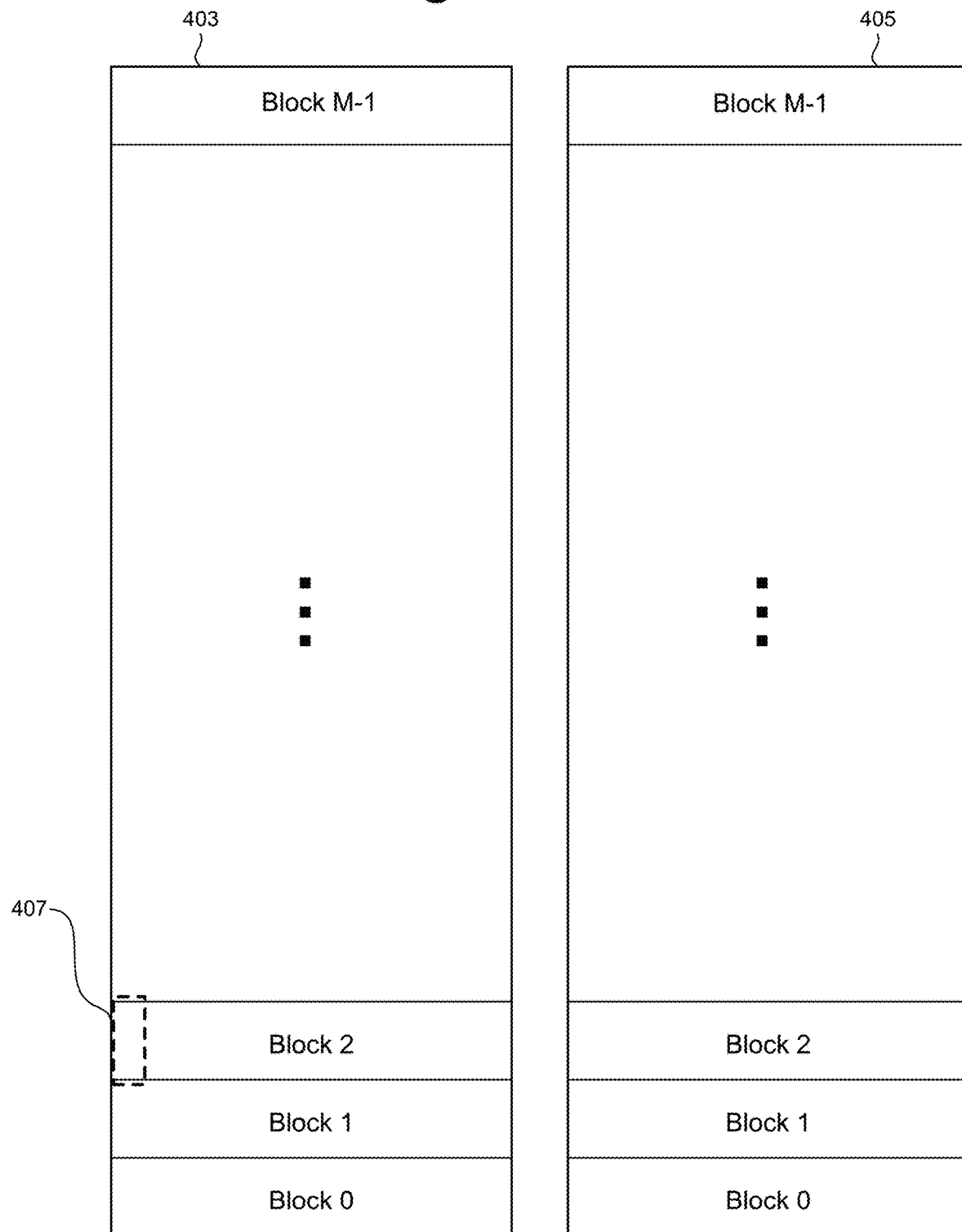
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
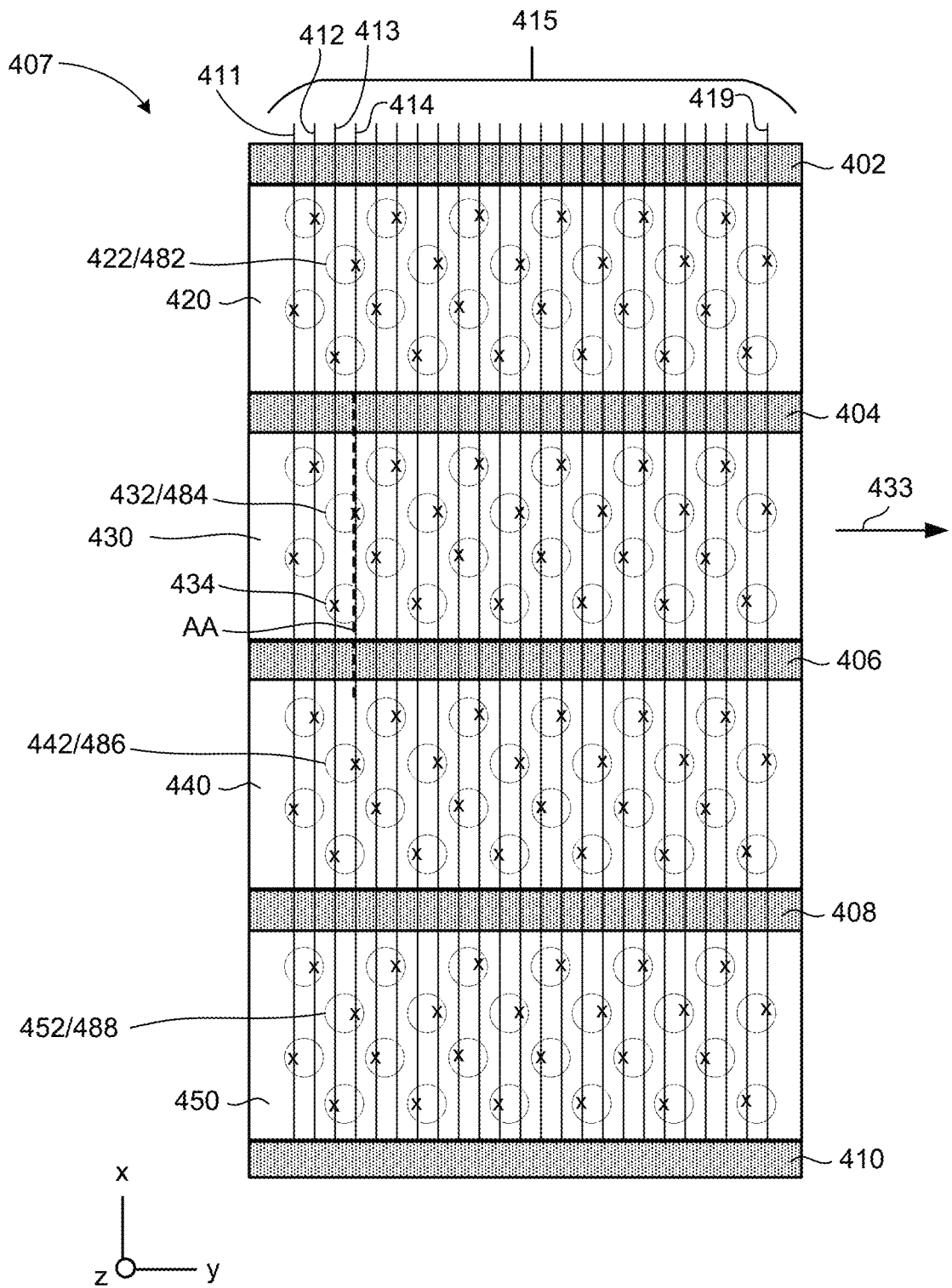
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408 and 410, which are formed of SiO$_2$; however, other dielectric materials can also be used. Isolation regions 402, 404, 406, 408 and 410 serve to divide the top layers of the block into four regions; for example, the top layer depicted in FIG. 4B is divided into regions 420, 430, 440, and 450 of which are referred to as sub-blocks. In one embodiment, isolation regions 402 and 410 separate the block 407 from adjacent blocks. Thus, isolation regions 402 and 410 may extend down to the substrate. In one embodiment, the isolation regions 430, 440, and 450 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each block has twenty four rows of active columns and each bit line connects to four rows in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
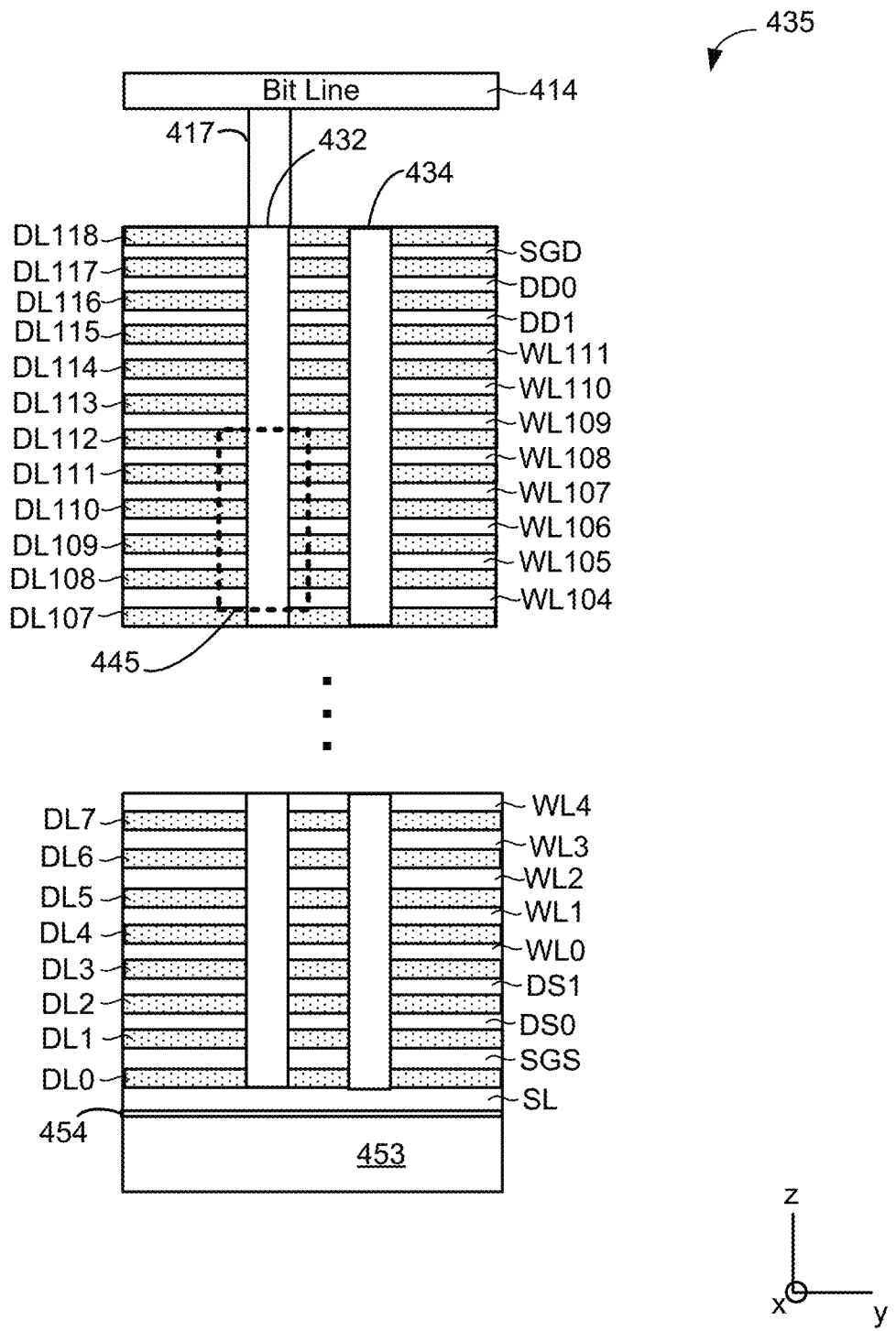
FIG. 4C depicts an embodiment of a stack showing a cross-sectional view along line AA of FIG. 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL111. Each NAND string has a drain side select transistor at the SGD layer. Each NAND string has a source side select transistor at the SGS layer. There may be more than one SGD layer, as well as more than one SGS layer. Also depicted are dielectric layers DL0-DL118.

Columns 432, 434 of memory cells are depicted in the multi-layer stack. The stack includes a substrate 453, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
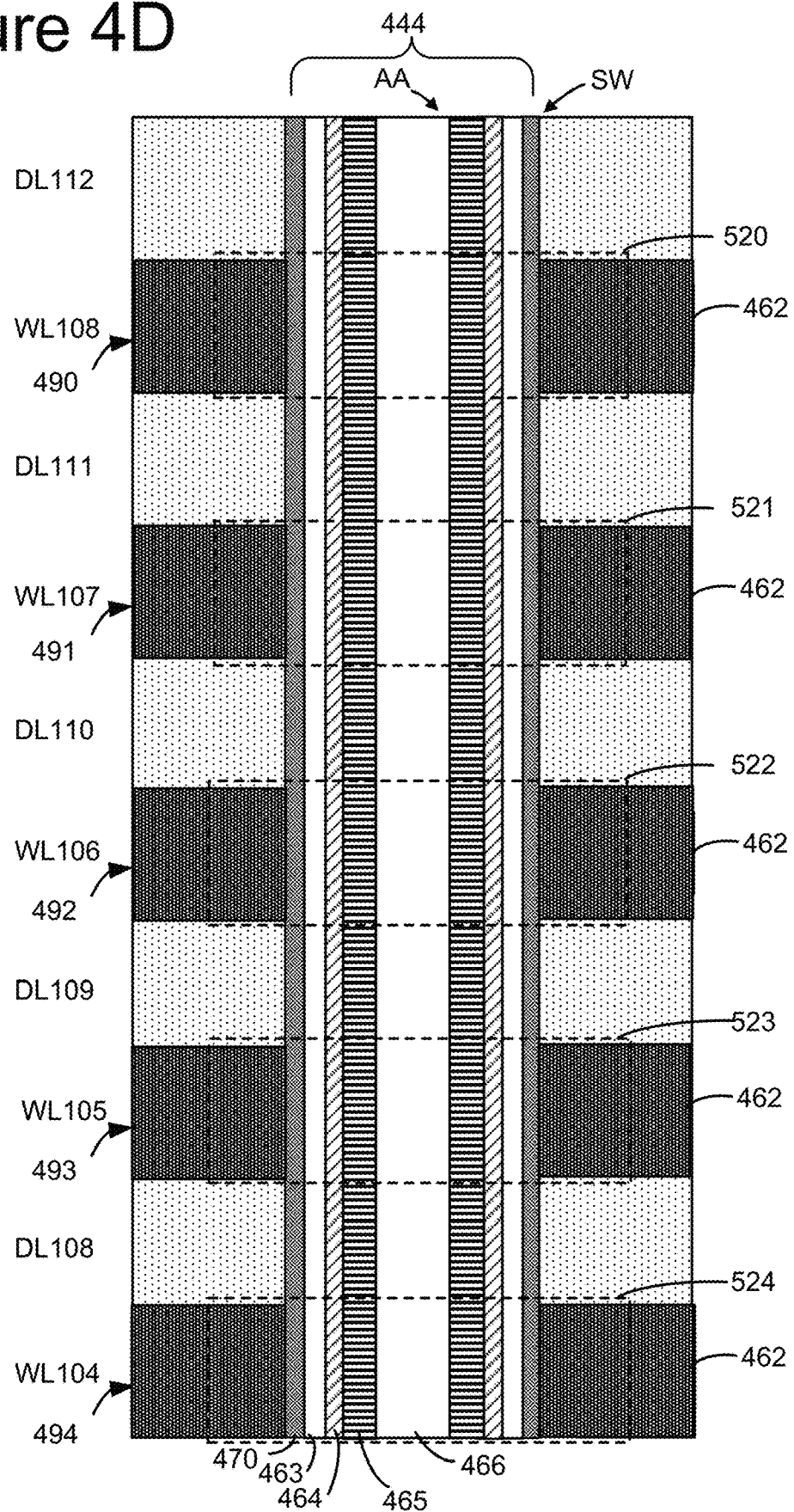
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
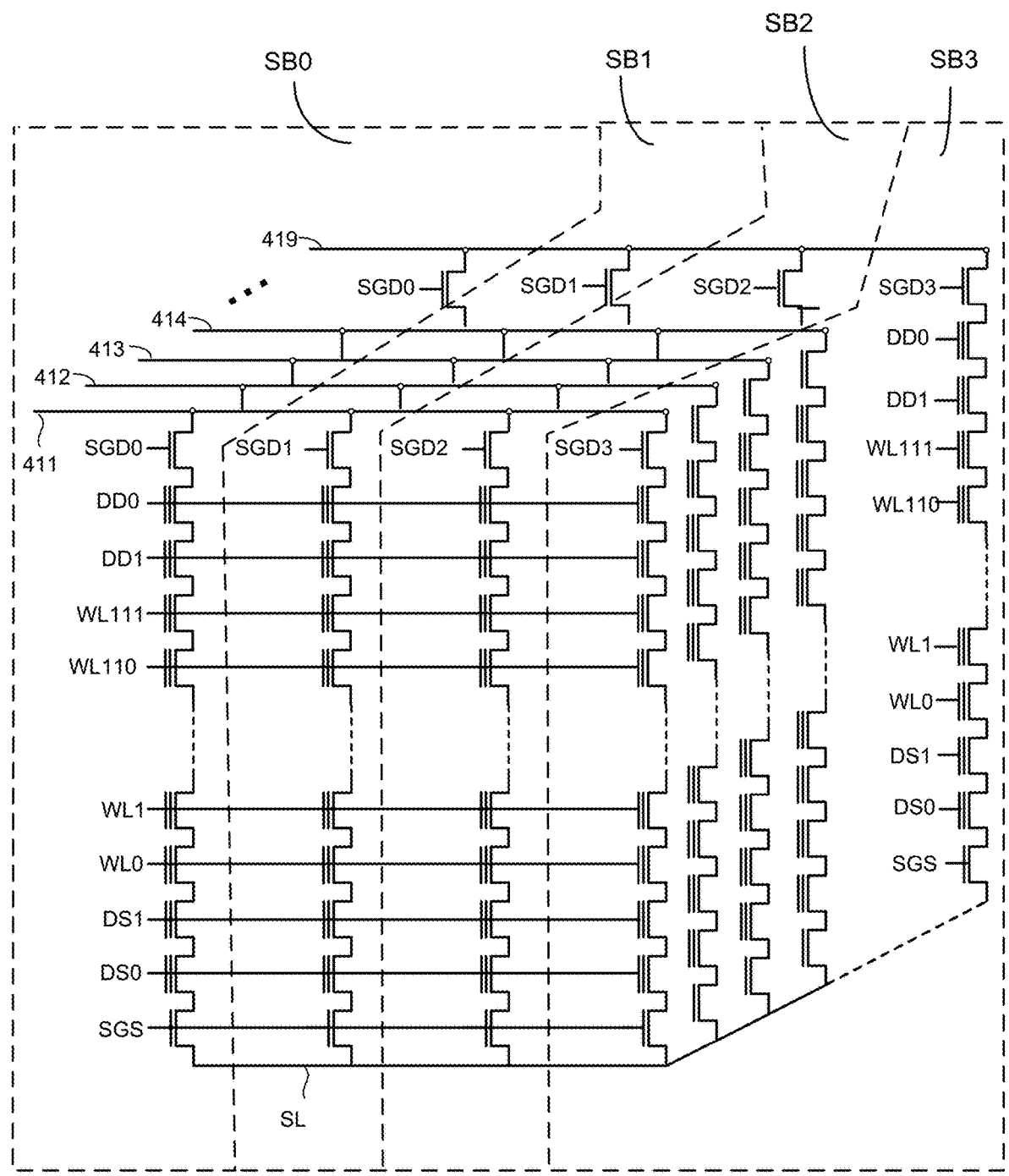
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL111 running across the entire block. The structure of FIG. 4E corresponds to portion 407 in Block 2 of FIGS. 4A-4B, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). A first sub-block corresponds to those vertical NAND strings controlled by SGD0. A second sub-block corresponds to those vertical NAND strings controlled by SGD1. A third sub-block corresponds to those vertical NAND strings controlled by SGD2. A fourth sub-block corresponds to those vertical NAND strings controlled by SGD4. There may be more or fewer than four sub-blocks in a block.

A source side selection line SGS connects/disconnects the NAND strings to/from the common source line. In some embodiments, there is a source side selection line for each sub-block (similar to the four SGD0, SGD1, SGD2, SGD3). The block can also be thought of as divided into four sub-blocks SB0, SB1, SB2 and SB3. Sub-block SB0 corresponds to those vertical NAND strings controlled by SGD0, Sub-block SB1 corresponds to those vertical NAND strings controlled by SGD1, Sub-block SB2 corresponds to those vertical NAND strings controlled by SGD2, and Sub-block SB3 corresponds to those vertical NAND strings controlled by SGD3.

Although the example memories of FIGS. 4-4E are three dimensional memory structure that includes vertical NAND strings with charge-trapping material, other (2D and 3D) memory structures can also be used with the technology described herein.

Figure 5A:
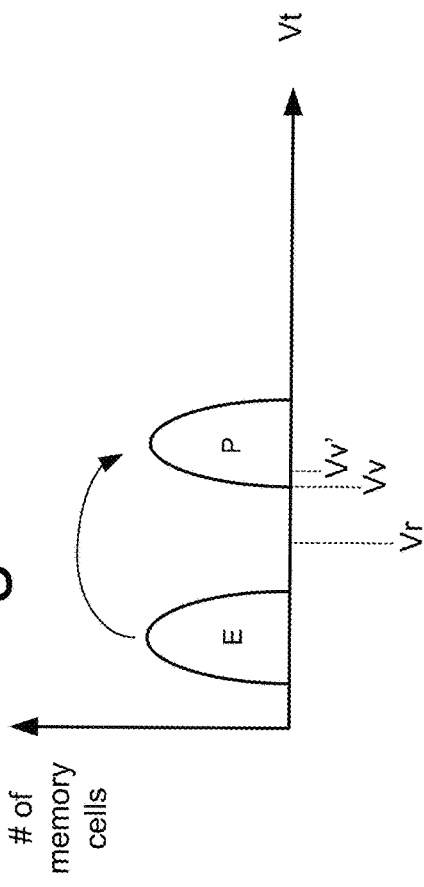
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts a default verify reference voltage Vv, as well as an up-shifted verify reference voltage Vv'. In some embodiments, when programming memory cells in a non-boundary group to data state P, the system will test whether those memory cells have a threshold voltage greater than or equal to Vv. In some embodiments, when programming memory cells in a boundary group to data state P, the system will test whether those memory cells have a threshold voltage greater than or equal to Vv'.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
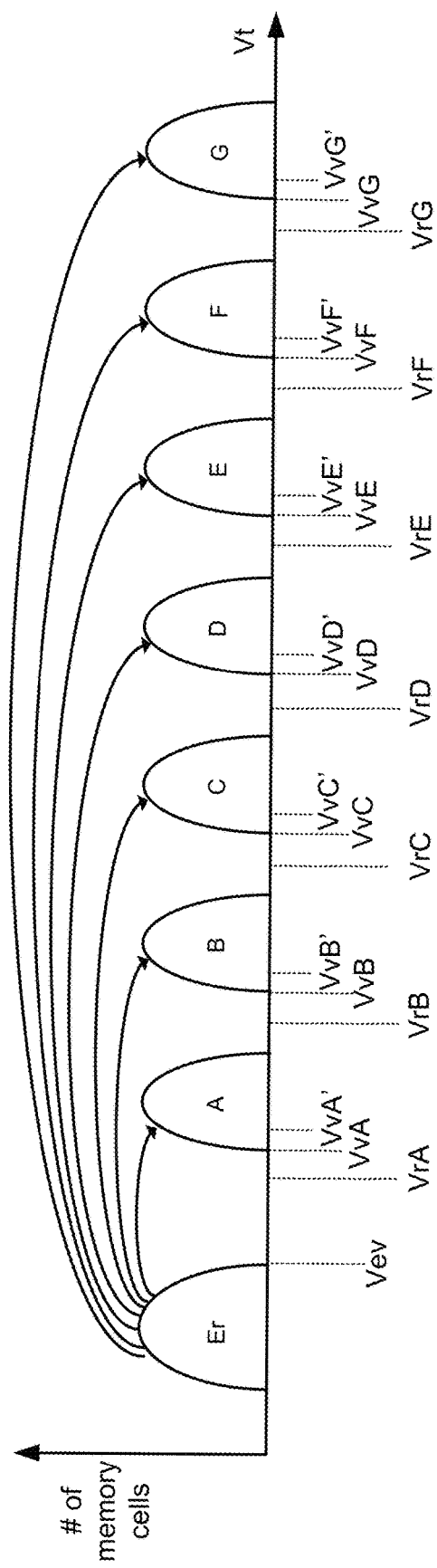

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of default verify reference voltages. The default verify reference voltages are VvA, VvB, VvC, VvD, VvE, VvF, and VvG. FIG. 5B also shows a number of up-shifted verify reference voltages. The up-shifted verify reference voltages are VvA', VvB', VvC', VvD', VvE', VvF', and VvG'. In one embodiment, the default verify reference voltages are VvA, VvB, VvC, VvD, VvE, VvF, and VvG are used when verifying memory cells in non-boundary groups. In one embodiment, the up-shifted verify reference voltages are VvA', VvB', VvC', VvD', VvE', VvF', and VvG' are used when verifying memory cells in boundary groups. For example, when programming memory cells in a non-boundary group to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

FIG. 5C depicts one embodiment of a first pass of another programming technique. In this example, referred to as foggy-fine (or course-fine) programming, the data states are programmed from the Erased-state to distributions using lower verify levels VvAl, VvBl, VvCl, VvDl, VvEl, VvFl and VvGl, respectively. This is the foggy (or course) programming pass. A relatively large program voltage step size may be used, for instance, to quickly program the storage elements to the respective lower verify levels.

FIG. 5D depicts one embodiment of a second pass of the foggy-fine programming technique referred to in FIG. 5C. The A-state, B-state, C-state, D-state, E-state, F-state, and G-state storage elements are programmed from the respective lower distributions to respective final distributions, using the nominal, higher verify levels VvAh, VvBh, VvCh, VvDh, VvEh, VvFh and VvGh, respectively. This is the fine programming pass. A relatively small program voltage step size may be used, for instance, to slowly program the storage elements to the respective final verify levels while avoiding a large overshoot. In an embodiment, both the lower verify levels (see FIG. 5C) and the higher verify levels (see FIG. 5D) may be upshifted when programming a boundary group.

Figure 6:
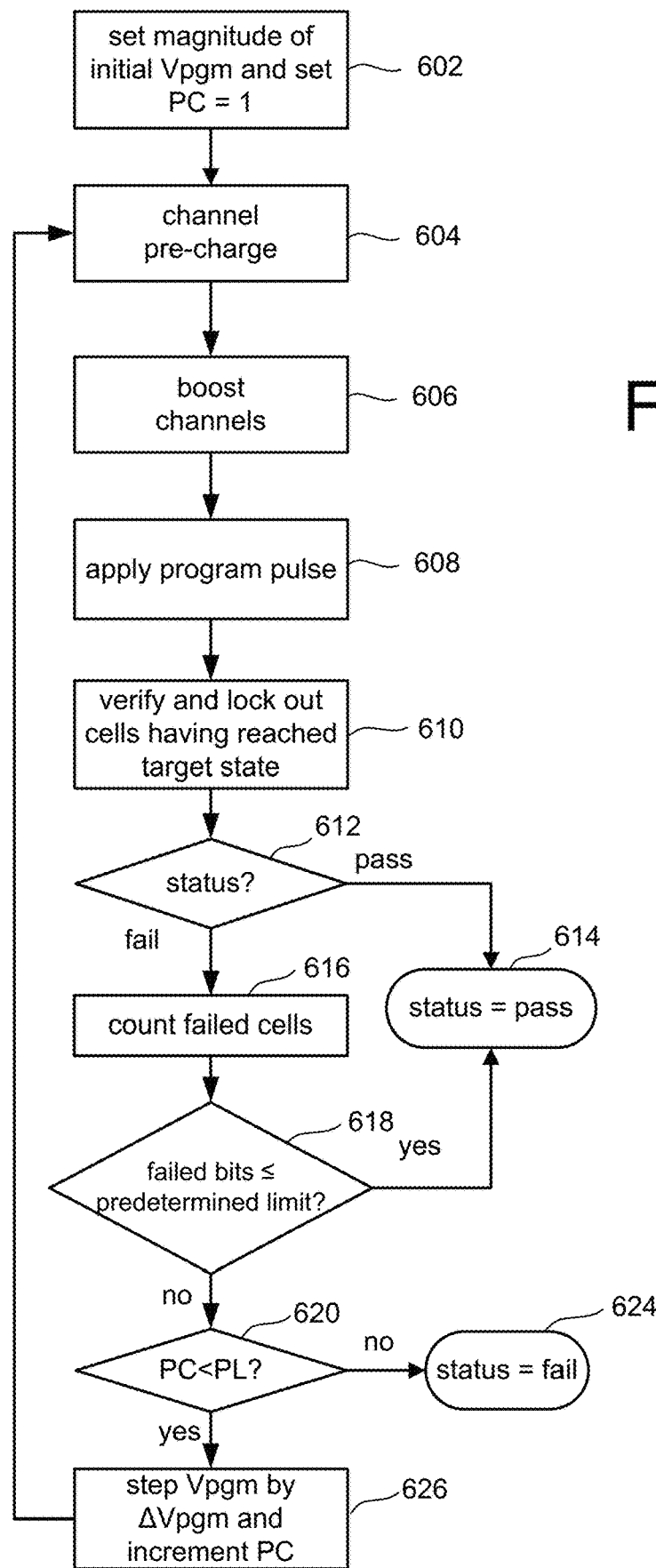
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In some embodiments, the magnitude of the verify reference voltages will depend on whether programing will result in an open block. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. In some embodiments, the program limit value will depend on whether programming will result in an open block. In one embodiment, the program limit value is higher if programming will result in an open block. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). In an embodiment, the step size ΔVpgm will depend on whether programming will result in an open block. In an embodiment, ΔVpgm will be smaller when programming will result in an open block comparing to ΔVpgm when programming will not result in an open block. After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B or 5D.

Technology is disclosed herein for a memory system boundary open block programming of non-volatile memory such as NAND. In an embodiment, the memory system will determine whether programming a group of memory cells connected to a word line in a selected block will result in an open block. If it will not result in an open block then the memory system uses a first set of programming parameters to program the group. However, if it will result in an open block then the memory system uses a second set of programming parameters to program the group. The second set of programming parameters help to mitigate any possible mis-reads if the group is read in the open block condition.

FIG. 7 is a diagram that depicts an open block 700. Note that the open block 700, as defined herein, refers to a state after programming the block has been at least temporarily suspended. For example, the open block 700 may result from there not being any more data from the host 102 to program into the block at this time. The data stored in the open block 700 can potentially be read in response to a request from the host 102 for the data. In the example in FIG. 7, the block is divided into four sub-blocks (SB0, SB1, SB2, SB3) consistent with the example in FIGS. 4B and 4E. It is not required that the block be divided into sub-blocks. When the block is divided into sub-blocks there may be more or fewer than four sub-blocks. In the example depicted in FIG. 7 the block is programmed consecutively from WL0 to WL111. A phrase such as "program data into a word line" means to program the data into memory cells whose control gates are connected to the word line. In an embodiment, the basic unit of programming is the combination of one word line and one sub-block. The programming order can vary, but in one embodiment, programming proceeds one word line at a time with the sub-blocks programmed in the order SB0, SB1, SB2, SB3. For example, the order may be WL0/SB0, WL0/SB1, WL0/SB2, WL0/SB3, WL1/SB0, WL1/SB1, WL1/SB2, WL1/SB3, etc. In the example in FIG. 7, all four sub-blocks have been programmed for WL0 through WLn-1. For WLn, only SB0 has been programmed. No data has yet been programmed into WLn+1/SB0, WLn/SB1, WLn/SB2, or WLn/SB3. Thus, memory cells at WLn+1/SB0, WLn/SB1, WLn/SB2, or WLn/SB3 are still erased (or unprogrammed). Therefore, the boundary groups are WLn/SB0, WLn-1/SB1, WLn-1/SB2, and WLn-1/SB3.

Each boundary group has a group on one side that is programmed and a group on the other side that is not yet programmed. For example, for WLn/SB0 the group at WLn-1/SB0 is programmed but the group at WLn+1/SB0 has not yet been programmed. The boundary group 720 for SB3 is referenced in FIG. 7. Also, the non-boundary groups 710 for SB3 are referenced in FIG. 7. Furthermore, the non-programmed (or open) groups 730 for SB3 are referenced in FIG. 7. The term "boundary word line" as used throughout this document refers to the word line (or portion thereof) connected to a boundary group. In FIG. 7, WLn in SB0 is a boundary word line, WLn-1 in SB1 is a boundary word line, WLn-1 in SB2 is a boundary word line, and WLn-1 in SB3 is a boundary word line.

In an embodiment, the memory system will determine whether programming a group will result in that group being a boundary group in the open block. Moreover, the memory system will use a different set of programming parameters when programming such a boundary group than when programming the non-boundary groups. It may be that the memory system will read one or more of the boundary groups at a later time. Using the different set of programming parameters can help to mitigate potential mis-reads when reading such boundary groups.

FIG. 8 depicts two sets of example threshold voltage distributions. One set of Vt distributions 801-808 is for a group of memory cells that are not a boundary group. The other set of Vt distributions 811-818 is for a group of memory cells that are a boundary group, but that are programmed using the same set of programming parameters as the non-boundary group. The programmed Vt distributions 812-818 for the boundary group have their Vt distributions down-shifted relative to the programmed Vt distributions 802-808 for the non-boundary group. A possible reason for the down-shift in the Vt distributions 812-818 is due to a lack of NWI for the boundary group. That is, the non-boundary groups each have an adjacent group that was programmed afterwards, thereby resulting in NWI for the non-boundary group. Thus, the lack of NWI for the boundary group results in the down-shift in the Vt distributions 812-818, relative to Vt distributions 802-808. Another possible factor in the down-shift in the Vt distributions 812-818 is due to differences in lateral DR between the boundary and non-boundary groups.

FIG. 9 depicts two sets of example Vt distributions. One set of Vt distributions 801-808 is for a non-boundary group. These are the same distributions 801-808 as discussed in connection with FIG. 8. The other set of Vt distributions 911-918 is for a boundary group, but that are programmed using one embodiment of a different set of programming parameters than used for the non-boundary group. FIG. 9 shows that Vt distributions 911-918 are narrower than Vt distributions 801-818. Thus, there is more read margin for Vt distributions 911-918 than for Vt distributions 801-818. However, the average Vt for a given distribution is about the same for the boundary and non-boundary groups.

In one embodiment, the verify levels used for the boundary groups is up-shifted relative to the verify level used for the non-boundary groups. For example, with reference to FIG. 5B, the default verify reference voltages VvA, VvB, VvC, VvD, VvE, VvF, and VvG may be used for a non-boundary group. However, up-shifted verify reference voltages VvA', VvB', VvC', VvD', VvE', VvF', and VvG' may be used for a boundary group. Using the up-shifted verify reference voltages for the boundary group can improve the Vt margin on the lower (or left) side of each individual Vt distribution. In an embodiment, both the lower verify levels (see FIG. 5C) and the higher verify levels (see FIG. 5D) may be upshifted when programming a boundary group.

In one embodiment, a smaller program step size is used the boundary groups relative to the program step size used for the non-boundary groups. A smaller program step size for the boundary group can improve the Vt margin on the upper (or right) side of each individual Vt distribution. FIG. 10 depicts an example of different program voltage step sizes for the non-boundary and boundary groups. A first sequence 1010 of program pulses are depicted in FIG. 10, along with a second sequence 1020 of program pulses. In an embodiment, one of the program pulses is applied to the memory cells in step 608 of the process of FIG. 6, with the magnitude of the pulse increased by $\Delta Vpgm$ in step 626. The first sequence 1010 of program pulses are increased by $\Delta Vpgm1$ with each program loop. The second sequence 1020 of program pulses are increased by $\Delta Vpgm2$ with each program loop. Note that $\Delta Vpgm2$ is significantly smaller than $\Delta Vpgm1$. Using the significantly smaller $\Delta Vpgm2$ for the boundary group helps to improve the Vt margin (see FIG. 9). In one embodiment, the total number of program loops that are allowed (see step 620 in FIG. 6) is increased when using the smaller $\Delta Vpgm$.

Figure 11:
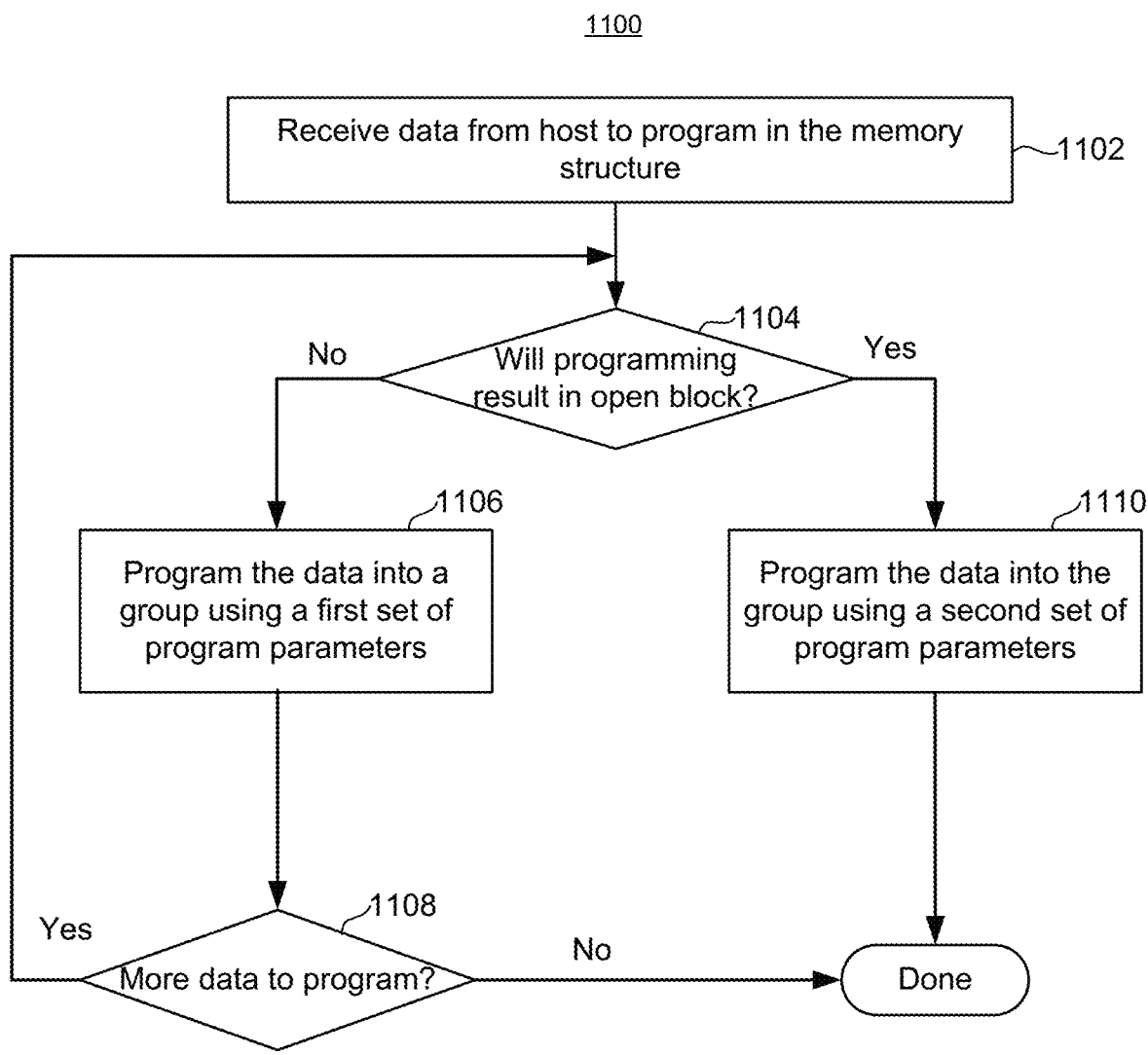
FIG. 11 is a flowchart of one embodiment of a process of programming memory cells.

FIG. 11 is a flowchart of one embodiment of a process 1100 of programming memory cells. Process 1100 refers to programming data into a block of memory cells. Prior to process 1100 the block of memory cells is erased. In process 1100, the memory cells are programmed one group at a time. The group of memory cells will be connected to the same word line; however, the memory cells connected to a word line may be divided into multiple groups that are programmed separately. In one embodiment, the block is divided into sub-blocks with the unit of programming being memory cells in one sub-block that are connected to the same word line. For example, the programming can proceed in the order depicted and described with respect to FIG. 7; however, that is only one example.

Step 1102 includes receiving data from host 102 to program into the memory structure 202. The host 102 does not need to specify what block that the data is to be programmed into. Also, the memory controller 120 may program data into different blocks at substantially the same time. For example, the memory controller 120 may direct the memory die to program data into multiple planes in parallel. To facilitate explanation, the discussion of process 1100 will focus on one block. Thus, the memory controller 120 may determine that there is a certain amount of data from the host 102 that the memory controller 120 will program into the block at this time. As will be discussed more fully below, in some cases there will not be sufficient data to fill the block which may result in an open block.

Step 1104 includes determining whether programming the data will result in an open block. In one embodiment, the memory system determines whether the group to be programmed will be a boundary group. As noted above, a boundary group will have an unprogrammed group adjacent to it after programming the block has been at least temporarily suspended. Thus, it is possible that the host could request a read of the data in the boundary group prior to programming any data (user data or dummy data) into the open group adjacent to the boundary group.

In one embodiment, the memory system 100 determines whether there will be an open block based on how much data remains to be programmed in this block. An open block may exist if there will be one or more groups of memory cells that will not be programmed when programming the block is at least temporarily suspended. The temporary suspension of programming may occur as a result of there being no more data from the host at this time to program into the block. In one embodiment, this determination is made on a sub-block basis. Further details are discussed below in connection with the discussion of FIG. 12.

Step 1106 is performed when programming a non-boundary group. Step 1106 includes programming a unit of data from the host into a group of memory cells using a first set of program parameters. The program parameters may include, but are not limited to, a set of program verify reference levels and/or a program voltage step size. Examples have been discussed above of default verify reference levels in, for example, FIGS. 5A and 5B. In one embodiment, the default verify reference levels are used in step 1106. An example has been discussed above of a first $\Delta Vpgm1$ in sequence 1010 in FIG. 10.

Step 1108 is a determination of whether there is more data to program. If so, then the process returns to step 1104 to determine whether programming the next group of memory cells will result in an open block. Assuming that it would result in an open block, then step 1110 is performed. Step 1110 is performed when programming a boundary group. Step 1110 includes programming a unit of data from the host into this boundary group of memory cells using a second set of program parameters. In one embodiment, the second set includes program verify reference levels that are upshifted from the first set. Examples have been discussed above of upshifted verify reference levels in, for example, FIGS. 5A and 5B. In one embodiment, the program voltage step size is smaller when programming will result in the open block. An example has been discussed above of a second $\Delta Vpgm2$ in sequence 1020 in FIG. 10. The upshifted program verify levels and/or the smaller program voltage step size helps to tighten the threshold voltage distributions (see Vt distributions 912-918 in FIG. 9), which reduces or eliminates any mis-reads if the group is read while the open block condition persists.

The process 1100 may end with either a closed block or an open block. A closed block occurs when all groups of memory cells in the block are programmed. This may occur, for example, when there is sufficient data from the host 102 at this time to fill the block. An open block occurs when at least one group of memory cells remains unprogrammed when programming the block is at least temporarily suspended, in which case the host 102 could request a read of the data programmed into the boundary group. Note that in the open block case the last group(s) of memory cells that were programmed will be programmed with the second set of program parameters, but typically there will be other groups previously programmed with the first set of program parameters. Also, it is possible that at a later point in time programming of the open block could resume such that data may be programmed into open groups. For example, at a later point in time the host 102 could provide more user data which may be programmed into the open block. In one embodiment, the programming of this additional user data may begin adjacent to the boundary groups. For example, referring to FIG. 7, at a later time user data from the host 102 can be programmed into the open groups 730. Therefore, the storage within the formerly open block is used efficiently. Also note that when programming of the partially block resumes, the process 1100 may be repeated on the partially programmed block.

Figure 12:
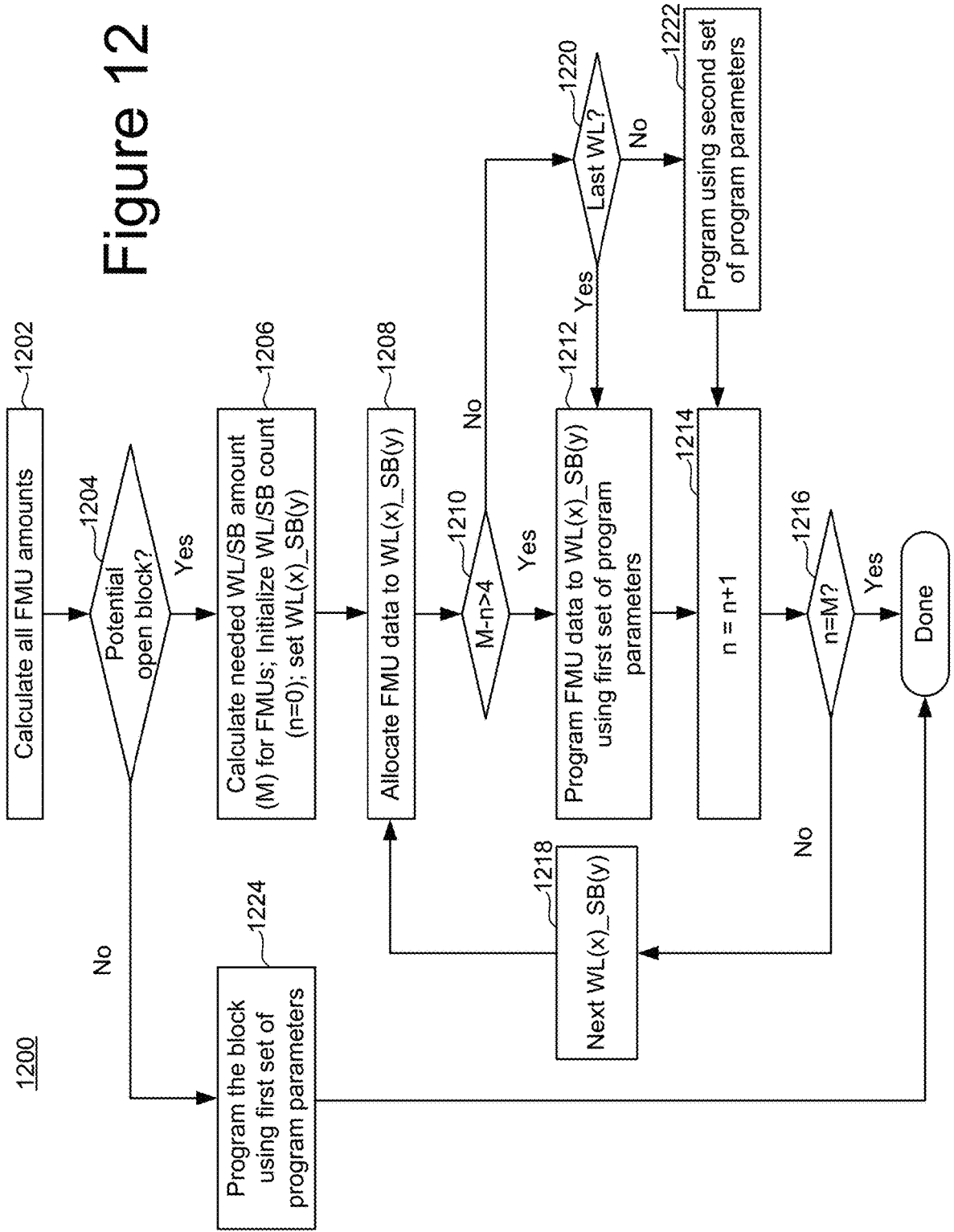
FIG. 12 is a flowchart of one embodiment of a process of programming a block of memory cells.

FIG. 12 is a flowchart of one embodiment of a process 1200 of programming a block of memory cells. The process 1200 provides further details of determining whether an open block will result. The process 1200 provides further details of one embodiment of process 1100.

Step 1202 includes calculating all Flash Management Unit (FMU) amounts. In one embodiment an FMU is four kilobytes (KB). In one embodiment, 16 KB of data are written in a word line/sub-block (WL/SB) combination. In the example depicted in FIG. 7, there are 112 word lines and four sub-blocks. Thus, in that example a total of 1792 FMUs could be programmed into the block. Step 1204 is a determination of whether there is the potential for an open block. If there are fewer FMUs than could be programmed into the block, then there is a potential for an open block.

If there is a potential for an open block, then in step 1206 some initial calculations and initializations are performed. The value M represents how many WL/SB units are needed to be able to program all of the FMUs. The integer n is used to track how many WL/SB units have been programmed. The value x tracks the number of the word line to be programmed. In an embodiment, the word lines are programmed consecutively from WL0 to higher numbers. In an embodiment, for each word line, all sub-blocks are programmed prior to proceeding to the next word line. The value y tracks the sub-block to be programmed. In an embodiment, the sub-blocks are programmed from SB0 to higher numbers.

Step 1208 includes allocating one or more FMUs of data (e.g., four FMUs may be programmed) to the present combination of WL/SB to be programmed (WL(x)_SB(y)). Step 1210 is a determination of whether programing the next WL/SB will result in a boundary group. In step 1210, the total number of WL/SBs (n) programmed thus far is subtracted from the WL/SB (M) to be programmed. If this is not greater than the number of sub-blocks (four in the present example), then there is a potential for a boundary group. Assuming that this is not the case, then in step 1212 a unit of the data is programmed into the current WL/SB using the first set of program parameters. Note that the unit of data may be more than one FMU. Step 1212 is one embodiment of step 1106 in FIG. 11. In step 1214, the total number of WL/SBs (n) programmed thus far is incremented by 1. In step 1216, a determination of made as to whether all of the needed WL/SB (M) have been programmed (e.g., test for whether n=M). Assuming that there is more data to program, then in step 1218 values of x and y are updated to point to the next WL/SB to be programmed. Then in step 1208 the next FMU data is allocated to that next WL/SB to be programmed. Again, a determination is made in step 1210 whether programming this WL/SB could result in a boundary group. For the sake of discussion, an example will be discussed in which it could. In step 1210 the test is essentially whether there are four or fewer WL/SBs left to program, which is based on the example in which there are four sub-blocks.

Step 1220 is a determination of whether the word line to be programmed is the last word line in the block. In the example of FIG. 7, this would be a determination of whether any sub-block on WL111 is being programmed. If WL111 is being programmed, then this does not constitute a boundary group as WL111 is the last data word line to be programmed in this example. Therefore, in step 1212 programming proceeds with the first set of program parameters. However, if this is not the last word line in the block, then in step 1222 programming of a unit of the data proceeds with the second set of program parameters. Referring to FIG. 7, one of the boundary groups 720 may be programmed in step 1222. In the example of FIG. 7 there are up to four boundary groups 720 (but there could be fewer than four if any data is programmed on WL111). Step 1222 is one embodiment of step 1110 in FIG. 11. Also note that steps 1210 and 1220 may be used in one embodiment of step 1104 of FIG. 11.

Returning again to the discussion step 1204, if it is initially determined that there is not the potential for an open block, then in step 1224 the block is programmed using the first set of program parameters. In this case, step 1222 will not be performed. Hence, all of the data may be programmed using the first (e.g., default) program parameters.

FIG. 13 is a flowchart of one embodiment of a process 1300 of the memory system establishing a temporary set of programming parameters to program data into a boundary group. The process 1300 may be used in an embodiment of step 1110 in FIG. 11. Thus, prior to process 1300 the memory controller 120 has already determined that the second (or temporary) set of programming parameters are to be used for programming a boundary group.

Step 1302 includes the memory controller 120 sending one or more commands to the die (memory die 200 or control die 211) to at least temporarily change one or more programming parameters. In one embodiment, the memory controller 120 sends a separate command for each programming parameter. In one embodiment, a command may contain one or more addresses that instruct the die where in the die to access the temporary programming parameter(s). In one embodiment, a command may contain data that is the temporary programming parameter itself.

Step 1304 includes the die accessing the one or more temporary programming parameter(s) from storage on the memory die and/or the commands. The following examples will be used to illustrate. In one embodiment, a dynamic program table (DPT) is stored in the memory structure 202 or some other non-volatile memory accessible to the die. The command(s) may contain an address in the DPT in order to point to a temporary programming parameter. FIG. 14 illustrates one embodiment of a DPT 1400. The DPT 1400 contains a number of rows, which are each for a different use case 1402. This allows the memory controller 120 to control which set of temporary programming parameter(s) are to be used. In one embodiment, the temporary programming parameters will depend on a factor such as which word line is being programmed. This allows for compensation for factors such as the memory hole diameter, which may depend on what word line is being programmed. The DPT 1400 includes upshift values 1404 for upshifting the verify reference levels. In this example, the levels correspond to data states A-G depicted in FIG. 5B. The numeric value refers to how much the verify reference voltage should be up-shifted. The DPT 1400 includes a $\Delta$Vpgm shift 1406, which indicates by how much the program voltage step size should be decreased (hence the negative value). The DPT 1400 includes a loop count shift 1408, which indicates how many additional program loops should be allowed for the program process to complete. Other programming parameters may be changed as well. For example, the DPT 1400 indicates that a STP_FINE 1410 option should be disabled. The STP_FINE option, when enabled, allows a verify operation for certain states to be skipped under certain conditions. However, in an embodiment, this option is disabled when using the temporary programming parameters. In an embodiment, the various entries in the DPT 1400 have an address associated with them, wherein the memory controller 120 may specify what parameter to use.

Returning again to the discussion of FIG. 13, in step 1306 the memory controller 120 sends to the die data to be programmed and the address of the memory cells at which to program the data. In an embodiment, this is the same or at least a similar program command as would be sent when using the default programming parameters. In step 1308, the die programs the data into the boundary group using the temporary programming parameters. In an embodiment, the memory controller 120 may send one or more additional commands to return the programming parameters to the default programming parameters. Note that the default programming parameters could also be specified in a table that is stored on the die. However, in an embodiment, the memory controller need not specify the address of this default table.

In view of the foregoing, a first embodiment includes an apparatus comprising one or more control circuits configured to connect to a three-dimensional memory structure comprising a plurality of groups of NAND strings having memory cells. The three-dimensional memory structure comprising a plurality of word lines. Each group of NAND strings is associated with a set of the word lines. The one or more control circuits are configured to receive data from a host. The one or more control circuits are configured to program the data into a selected group of the NAND strings, wherein each group of memory cells is connected to a word line. The programming includes programming non-boundary groups of memory cells with a first set of program parameters responsive to a determination that at least one more group of the groups of memory cells is yet to be programmed with the data. The programming includes programming a boundary group of the memory cells with a second set of program parameters responsive to a determination there will be an unprogrammed group adjacent to the boundary group after programming the data from the host.

In a second embodiment, in furtherance to the first embodiment, programming the boundary group with the second set of program parameters results in boundary group threshold voltage (Vt) distributions. Programming the non-boundary groups with the first set of program parameters results in non-boundary group Vt distributions. Individual Vt distributions of the boundary group threshold voltage distributions are tighter than corresponding individual Vt distributions of the non-boundary group threshold voltage distributions.

In a third embodiment, in furtherance to the first or second embodiments, the first set of program parameters comprises a first set of verify voltages. Each verify voltages in the first set verifies memory cells being programmed to a different target state. The second set of program parameters comprises a second set of verify voltages that also verify memory cells being programmed to the different target states. The second set of verify voltages test for higher threshold voltages than corresponding verify voltages in the first set of verify voltages.

In a fourth embodiment, in furtherance to any of the third embodiment, the first set of program parameters further comprises a first program voltage step size. The second set of program parameters further comprises a second program voltage step size that is smaller than the first program voltage step size.

In a fifth embodiment, in furtherance the any of the first to second embodiment, the first set of program parameters further comprises a first program voltage step size. The second set of program parameters further comprises a second program voltage step size that is smaller than the first program voltage step size.

In a sixth embodiment, in furtherance the any of the first to fifth embodiments, the one or more control circuits are configured to read the boundary group in response to a request from a host prior to programming any data into the unprogrammed group adjacent to the boundary group.

In a seventh embodiment, in furtherance of the sixth embodiment, the one or more control circuits are configured to determine whether programming a unit of the data from the host will result in the boundary group based on how much of the received data remains to be programmed into groups of memory cells on the selected group of the NAND strings.

In an eighth embodiment, in furtherance to any of the first to seventh embodiments, the one or more control circuits are configured to program the groups of memory cells to multiple bits per memory cell.

In a ninth embodiment, in furtherance to the eighth embodiment, the one or more control circuits are configured to program the groups of memory cells to a single bit per memory cell.

In a tenth embodiment, in furtherance to the eighth embodiment, the second set of program parameters depends on a location of the boundary group along the set of NAND strings.

One embodiment includes a method for programming memory cells in a three-dimensional memory structure. The memory cells are arranged as blocks having NAND strings and word lines associated with the NAND strings. The method comprises determining whether programming user data into respective groups of memory cells connected to the word lines in a selected block will result in an open block after programming the user data. The method comprises programming a first unit of the user data into a first group of memory cells connected to a first word line with a first set of program parameters responsive to a determination that programming the first group of memory cells will not result in an open block. The method comprises programming a second unit of the user data into a second group of memory cells connected to a second word line with a second set of program parameters responsive to a determination that programming the second group of memory cells will result in an open block.

One embodiment includes a non-volatile storage system comprising a three-dimensional memory structure comprising blocks comprising vertically oriented NAND strings having memory cells, each block comprising a plurality of word lines. The non-volatile storage system comprises one or more control circuits in communication with the three-dimensional memory structure. The one or more control circuits are configured to receive data from a host. The one or more control circuits are configured to determine whether the data is sufficient to program an entire block of memory cells, wherein the block will be an open block if the data is insufficient to program the entire block. The one or more control circuits are configured to program the data into consecutive word lines in the open block responsive to a determination that the block will be an open block, including: program units of the data into memory cells connected to non-boundary word lines in the open block with a first set of program parameters; and program one or more units of the data into memory cells connected to a boundary word line in the open block with a second set of program parameters, wherein the boundary word line is adjacent to a word line having unprogrammed memory cells after programming the data from the host.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure comprising blocks, each block having a plurality of word lines and NAND strings associated with the word lines, wherein the one or more control circuits are configured to:
receive data from a host; and
program the data into groups of memory cells in a selected block, wherein each group of memory cells resides on a group of the NAND strings and is connected to a word line in the selected block, including:
program non-boundary groups of memory cells connected to a first set of one or more word lines in the selected block with a first set of program parameters responsive to a determination that at least one more group of the groups of memory cells is yet to be programmed with the data; and
program one or more boundary groups of the memory cells connected to a second set of one or more word lines in the selected block with a second set of program parameters responsive to a determination that there will be an unprogrammed group of memory cells in the selected block adjacent to each of the one or more boundary groups after programming the data from the host.

2. The apparatus of claim 1, wherein:
programming the one or more boundary groups with the second set of program parameters results in boundary group threshold voltage (Vt) distributions; and
programming the non-boundary groups with the first set of program parameters results in non-boundary group Vt distributions, wherein individual Vt distributions of the boundary group threshold voltage distributions are tighter than corresponding individual Vt distributions of the non-boundary group Vt distributions.

3. The apparatus of claim 1, wherein:
the first set of program parameters comprises a first set of verify voltages, wherein each verify voltage in the first set of verify voltages verifies memory cells being programmed to a different target state; and
the second set of program parameters comprises a second set of verify voltages that also verify memory cells being programmed to the different target states, wherein the verify voltages in the second set of verify voltages test for higher threshold voltages than corresponding verify voltages in the first set of verify voltages.

4. The apparatus of claim 3, wherein:
the first set of program parameters further comprises a first program voltage step size; and
the second set of program parameters further comprises a second program voltage step size that is smaller than the first program voltage step size.

5. The apparatus of claim 1, wherein:
the first set of program parameters further comprises a first program voltage step size; and
the second set of program parameters further comprises a second program voltage step size that is smaller than the first program voltage step size.

6. The apparatus of claim 1, wherein the one or more control circuits are further configured to:
read a first boundary group of the one or more boundary groups in response to a request from a host prior to programming any data into the unprogrammed group adjacent to the first boundary group.

7. The apparatus of claim 1, wherein the one or more control circuits are further configured to:
determine whether programming a unit of the data from the host will result in the one or more boundary groups based on how much of the received data remains to be programmed into groups of memory cells in the selected block.

8. The apparatus of claim 1, wherein the one or more control circuits are configured to program the groups of memory cells to multiple bits per memory cell.

9. The apparatus of claim 1, wherein the one or more control circuits are configured to program the groups of memory cells to a single bit per memory cell.

10. The apparatus of claim 1, wherein the second set of program parameters depends on a location of the one or more boundary groups along the set of NAND strings.

11. A method for programming memory cells in a three-dimensional memory structure, wherein the memory cells are arranged as blocks having NAND strings and word lines associated with the NAND strings, the method comprising:
determining whether programming user data into respective groups of memory cells connected to the word lines in a selected block will result in an open block after programming the user data;
programming a first unit of the user data into a first group of memory cells connected to a first word line with a first set of program parameters responsive to a determination that programming the first group of memory cells will not result in an open block; and
programming a second unit of the user data into a second group of memory cells connected to a second word line with a second set of program parameters responsive to a determination that programming the second group of memory cells will result in an open block.

12. The method of claim 11, wherein:
programming the first group of memory cells with the first set of program parameters comprises verifying the first group of memory cells using a first set of verify levels, wherein each verify level in the first set verifies memory cells being programmed to a different target state; and
programming the second group of memory cells with a second set of program parameters comprises verifying the second group of memory cells using a second set of verify levels that also verify memory cells being programmed to the different target states, wherein the second set of verify levels are upshifted from the first set of verify levels.

13. The method of claim 12, wherein:
programming the first group of memory cells with the first set of program parameters comprises increasing a magnitude of a program voltage by a first step size from one program loop to a next program loop; and
programming the second group of memory cells with the second set of program parameters comprises increasing a magnitude of the program voltage by a second step size from one program loop to a next program loop, wherein the second step size is smaller than the first step size.

14. The method of claim 11, wherein:
programming the first group of memory cells with the first set of program parameters comprises increasing a magnitude of a program voltage by a first step size from one program loop to a next program loop; and
programming the second group of memory cells with the second set of program parameters comprises increasing a magnitude of the program voltage by a second step size from one program loop to a next program loop, wherein the second step size is smaller than the first step size.

15. A non-volatile storage system comprising
a three-dimensional memory structure comprising blocks comprising vertically oriented NAND strings having memory cells, each block comprising a plurality of word lines; and
one or more control circuits in communication with the three-dimensional memory structure, wherein the one or more control circuits are configured to:
receive data from a host;
determine whether the data is sufficient to program an entire block of memory cells, wherein the block will be an open block if the data is insufficient to program the entire block; and
responsive to a determination that the block will be an open block, program the data into consecutive word lines in the open block including:
program units of the data into memory cells connected to non-boundary word lines in the open block with a first set of program parameters; and
program one or more units of the data into memory cells connected to a boundary word line in the open block with a second set of program parameters, wherein the boundary word line is adjacent to a word line having unprogrammed memory cells after programming the data from the host.

16. The non-volatile storage system of claim 15, wherein:
the first set of program parameters comprises a first set of verify levels, wherein each verify level in the first set verifies memory cells being programmed to a different target state; and
the second set of program parameters comprises a second set of verify levels that also verify memory cells being programmed to the different target states, wherein the second set of verify levels have higher magnitudes than the first set of verify levels.

17. The non-volatile storage system of claim 16, wherein:
the first set of program parameters further comprises a first program voltage step size; and
the second set of program parameters further comprises a second program voltage step size that is smaller than the first program voltage step size.

18. The non-volatile storage system of claim 15, wherein:
the first set of program parameters further comprises a first program voltage step size; and
the second set of program parameters further comprises a second program voltage step size that is smaller than the first program voltage step size.

19. The non-volatile storage system of claim 15, wherein the one or more control circuits are configured to:
read the one or more units of the data from the memory cells connected to the boundary word line in the open block prior to programming any data into a group of memory cells connected to a word line that neighbors the boundary word line.

20. The non-volatile storage system of claim 15, wherein the second set of program parameters depends on a location of the boundary word line in the open block.

* * * * *